(12) United States Patent
Fuerhoff et al.

(10) Patent No.: US 6,776,840 B1
(45) Date of Patent: Aug. 17, 2004

(54) METHOD AND APPARATUS FOR CONTROLLING DIAMETER OF A SILICON CRYSTAL IN A LOCKED SEED LIFT GROWTH PROCESS

(75) Inventors: Robert H. Fuerhoff, St. Charles, MO (US); Steven L. Kimbel, St. Charles, MO (US)

(73) Assignee: MEMC Electronic Materials, Inc., St. Peters, MO (US)

(*) Notice: Subject to any disclaimer, the term of this patent is extended or adjusted under 35 U.S.C. 154(b) by 0 days.

(21) Appl. No.: 09/502,340

(22) Filed: Feb. 10, 2000

Related U.S. Application Data
(60) Provisional application No. 60/125,456, filed on Mar. 22, 1999.

(51) Int. Cl.$^7$ ................................................. C03B 15/20
(52) U.S. Cl. .............................. 117/15; 117/13; 117/14; 117/11
(58) Field of Search ............................. 117/11, 13, 14, 117/15

(56) References Cited

U.S. PATENT DOCUMENTS

| | | | |
|---|---|---|---|
| 3,761,692 A | * | 9/1971 | Cope ........................ 235/151.1 |
| 4,857,278 A | | 8/1989 | Gevelber et al. ............. 422/249 |
| 4,876,438 A | * | 10/1989 | Watanabe et al. ............ 219/497 |
| 5,089,238 A | * | 2/1992 | Araki et al. ................. 422/249 |
| 5,178,720 A | | 1/1993 | Frederick .................. 156/618.1 |
| 5,223,078 A | * | 6/1993 | Maeda et al. ................ 156/601 |
| 5,408,952 A | * | 4/1995 | Wakabayashi et al. ....... 117/201 |
| 5,653,799 A | | 8/1997 | Fuerhoff ...................... 117/14 |
| 5,665,159 A | | 9/1997 | Fuerhoff ...................... 117/201 |
| 5,795,381 A | * | 8/1998 | Holder ......................... 117/14 |
| 5,846,318 A | | 12/1998 | Javidi ........................... 117/14 |
| 5,882,402 A | | 3/1999 | Fuerhoff ...................... 117/201 |
| 5,935,328 A | | 8/1999 | Cherko et al. ............... 117/218 |
| 5,968,263 A | * | 10/1999 | Grover et al. ................. 117/14 |
| 6,056,819 A | * | 5/2000 | Ogawa et al. ................. 117/14 |
| 6,241,818 B1 | * | 6/2001 | Kimbel et al. ................ 117/13 |

FOREIGN PATENT DOCUMENTS

| | | |
|---|---|---|
| EP | 0 446 628 A1 | 9/1991 |
| EP | 0 482 438 A1 | 4/1992 |
| EP | 0 499 220 A1 | 8/1992 |
| EP | 0 536 405 A1 | 4/1993 |
| EP | 0 821 082 A1 | 1/1998 |
| JP | 04325487 | 4/1991 |

\* cited by examiner

*Primary Examiner*—Nadine G. Norton
*Assistant Examiner*—Matthew Anderson
(74) *Attorney, Agent, or Firm*—Senniger, Powers, Leavitt & Roedel (57) ABSTRACT

A method and apparatus for controlling the diameter of a monocrystalline ingot as it is being pulled from a melt by changing the temperature of the melt. The ingot is pulled from the melt at a target rate that substantially follows a predetermined velocity profile. A temperature model represents variations in the melt temperature in response to variations in power supplied to a heater for heating the melt. In generating a temperature set point representing a target melt temperature, an error between a target diameter and a measured diameter of the ingot is determined and proportional-integral-derivative (PID) control is performed on the error signal. The PID control generates the temperature set point as a function of the error signal. In turn, the temperature model determines a power set point for the power supplied to the heater as a function of the temperature set point generated by the PID control and the power supplied to the heater is adjusted according to the power set point.

14 Claims, 10 Drawing Sheets

METHOD AND APPARATUS FOR CONTROLLING DIAMETER OF A SILICON CRYSTAL IN A LOCKED SEED LIFT GROWTH PROCESS

CROSS REFERENCE TO RELATED APPLICATION

This application claims the benefit of U.S. provisional application Serial No. 60/125,456 filed Mar. 22, 1999, the entire disclosure of which is incorporated herein by reference.

BACKGROUND OF THE INVENTION

This invention relates generally to improvements in controlling growth processes of single crystal semiconductors for use in the manufacture of electronic components and, particularly, to a method and apparatus for accurately controlling the diameter of a single crystal silicon ingot being pulled from a semiconductor source melt according to a predetermined velocity profile.

Monocrystalline, or single crystal, silicon is the starting material in most processes for fabricating semiconductor electronic components. Crystal pulling machines employing the Czochralski crystal growth process produce the majority of single crystal silicon. Briefly described, the Czochralski process involves melting a charge of high-purity polycrystalline silicon in a quartz crucible located in a specifically designed furnace. After the heated crucible melts the silicon charge, a crystal lifting mechanism lowers a seed crystal into contact with the molten silicon. The mechanism then withdraws the seed to pull a growing crystal from the silicon melt. A typical crystal lifting mechanism suspends the seed crystal from one end of a cable, the other end of which is wrapped around a drum. As the drum rotates, the seed crystal moves up or down depending on the direction that the drum is rotating.

After formation of a crystal neck, the growth process enlarges the diameter of the growing crystal by decreasing the pulling rate and/or the melt temperature until a desired diameter is reached. By controlling the pull rate and the melt temperature while compensating for the decreasing melt level, the main body of the crystal is grown so that it has an approximately constant diameter (i.e., it is generally cylindrical). Near the end of the growth process but before the crucible is emptied of molten silicon, the process gradually reduces the crystal diameter to form an end cone. Typically, the end cone is formed by increasing the crystal pull rate and heat supplied to the crucible. When the diameter becomes small enough, the crystal is then separated from the melt. During the growth process, the crucible rotates the melt in one direction and the crystal lifting mechanism rotates its pulling cable, or shaft, along with the seed and the crystal, in an opposite direction.

Although presently available Czochralski growth processes have been satisfactory for growing single crystal silicon useful in a wide variety of applications, further improvements are still desired. For example, a number of defects in single crystal silicon form in the crystal growth chamber as the crystal ingot cools after solidification. Such defects arise, in part, due to the presence of an excess (i.e., a concentration above the solubility limit) of intrinsic point defects known as vacancies and self-interstitials. It has been suggested that the type and initial concentration of these point defects in the silicon can influence the type and presence of agglomerated defects in the final product. If these concentrations reach a level of critical supersaturation in the system and the mobility of the point defects is sufficiently high, a reaction, or an agglomeration event, will likely occur. Agglomerated intrinsic point defects in silicon can severely impact the yield potential of the material in the production of complex integrated circuits.

Accurately pulling a single crystal silicon ingot from a melt according to a predetermined velocity profile, or target, specified in a crystal "recipe" helps satisfy process needs for controlling the formation of defects. For example, this type of control (herein referred to as a "locked seed lift" process) reduces the number and concentration of intrinsic point defects in the ingot. In addition, a locked seed lift process helps control the concentration of vacancies and self-interstitials to prevent an agglomeration of intrinsic point defects in the ingot as the ingot cools from the solidification temperature. Conventional Czochralski silicon growth processes, however, vary the pull rate, or seed lift, to control the diameter of the growing crystal. Those skilled in the art recognize that increasing pull rate causes a reduction in crystal diameter while decreasing the pull rate causes an increase in diameter. It is also well known that increasing the temperature of the silicon source melt causes a reduction in crystal diameter while decreasing the melt temperature causes an increase in diameter. For these reasons, controlling the pull rate according to a target profile can lead to diameter errors unless the melt temperature is accurately adjusted during pulling.

Unfortunately, using the pull rate to control crystal diameter is generally preferred in conventional growth processes because the delay in effecting melt temperature changes is usually unacceptable. In other words, the selection of pull rate instead of temperature to control diameter is based on the difference in response times, the response time for temperature changes being much slower than the response time for pull rate changes. For example, a step change in pull rate typically achieves a diameter response in seconds whereas a step change in heater power or melt temperature results in a much more sluggish response taking tens of minutes to achieve an equivalent effect.

For these reasons, an accurate and reliable apparatus and method for pulling a single crystal silicon ingot from a melt is desired for controlling the diameter of a silicon crystal using only heater power and eliminating the pull rate variability typically required to control diameter.

SUMMARY OF THE INVENTION

The invention meets the above needs and overcomes the deficiencies of the prior art by providing a method and apparatus for adjusting power for maintaining adequate control of crystal diameter in a locked seed lift process. Among the several objects of the invention may be noted the provision of a method and apparatus that provides accurate diameter control; the provision of such method and apparatus that adjusts the crystal diameter by changing the melt temperature; the provision of such method and apparatus that provides relatively fast melt temperature changes; the provision of such method and apparatus that permits modeling the temperature response of the melt; the provision of such method and apparatus that permits changing the crystal diameter as a function of heater power, the provision of such method and apparatus that may be incorporated into existing crystal pulling devices; and the provision of such method and apparatus that is economically feasible and commercially practical.

Briefly described, a method embodying aspects of the invention is for use in combination with an apparatus for growing a monocrystalline ingot according to the Czochralski process. The apparatus has a heated crucible containing a semiconductor melt from which the ingot is grown on a seed crystal that is pulled from the melt. The method includes pulling the ingot from the melt at a target rate that substantially follows a predetermined velocity profile. The method also includes the step of defining a temperature model representative of variations in the temperature of the melt in response to variations in power supplied to a heater for heating the melt. In generating a temperature set point representing a target melt temperature, the method next includes the steps of generating a signal representative of an error between a target diameter and a measured diameter of the ingot, performing proportional-integral-derivative (PID) control on the error signal and generating the temperature set point as a function thereof The method further includes determining a power set point for the power supplied to the heater from the temperature model as a function of the temperature set point generated by the PID control and adjusting the power supplied to the heater according to the power set point. In this manner, the temperature of the melt is changed for controlling the diameter of the ingot.

Another embodiment of the invention is directed to an apparatus for use in combination with an apparatus for growing a monocrystalline ingot according to the Czochralski process. The apparatus has a heated crucible containing a semiconductor melt from which the ingot is grown on a seed crystal that is pulled from the melt. The apparatus includes a predetermined velocity profile and the ingot is pulled from the melt at a target rate substantially following the velocity profile. The apparatus also includes a PID control generating a temperature set point as a function of an error between a target diameter and a measured diameter of the ingot. The temperature set point represents a target temperature of the melt. A temperature model represents variations in the temperature of the melt in response to variations in power supplied to a heater for heating the melt. The temperature model determines a power set point for the power supplied to the heater as a function of the temperature set point generated by the PID control. The apparatus further includes a heater for heating the melt and a power supply responsive to the power set point for adjusting the power applied to the heater. In this manner, the apparatus changes the temperature of the melt to control the diameter of the ingot.

Alternatively, the invention may comprise various other methods and apparatuss.

Other objects and features will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF PREFERRED EMBODIMENTS

Figure 1:
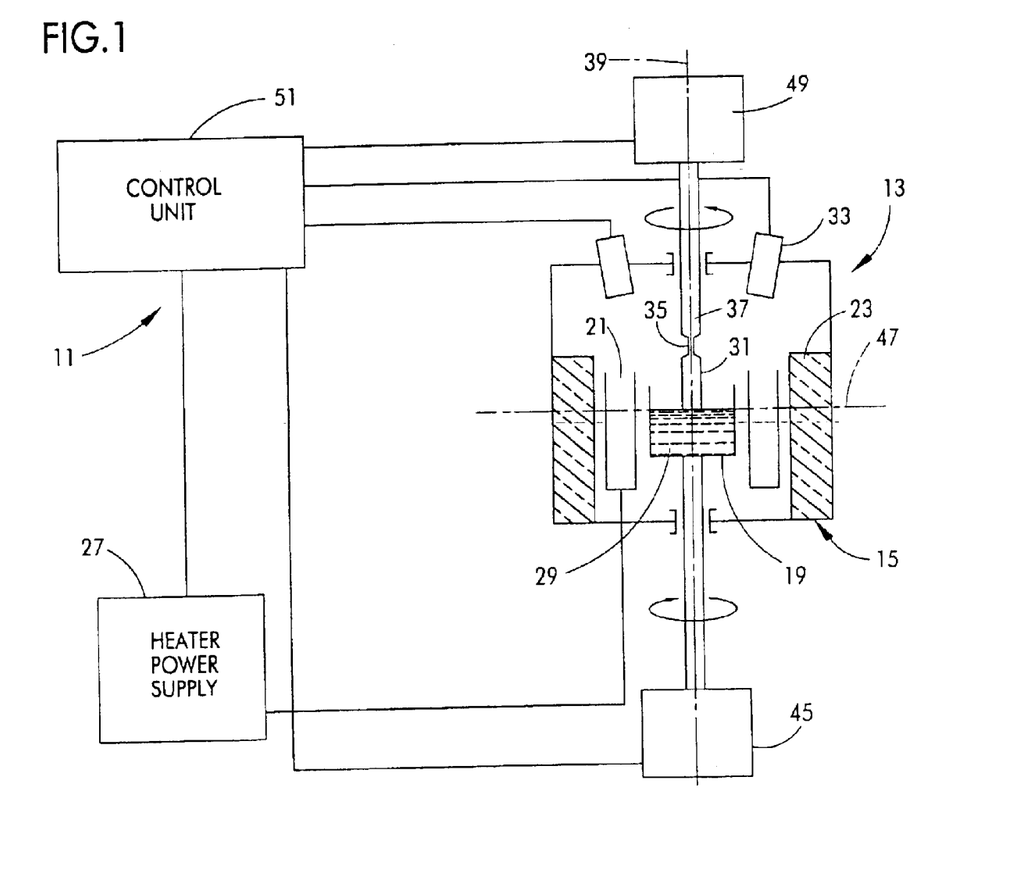
FIG. 1 is an illustration of a crystal growing apparatus and an apparatus according to the present invention for controlling the crystal growing apparatus.

Referring now to FIG. 1, an apparatus, indicated generally at 11, is shown for use with a Czochralski crystal growing apparatus, indicated generally at 13. The details of construction of the crystal growing apparatus 13 are well known to those of ordinary skill in the art. In general, crystal growing apparatus 13 includes a vacuum chamber 15 enclosing a crucible 19. Heating means such as a resistance heater 21 surrounds the crucible 19. In one embodiment, insulation 23 lines the inner wall of vacuum chamber 15 and a chamber cooling jacket (not shown) fed with water surrounds it. A vacuum pump (not shown) typically removes gas from within the vacuum chamber 15 as an inert atmosphere of argon gas is fed into it.

According to the Czochralski single crystal growth process, a quantity of polycrystalline silicon, or polysilicon, is charged to crucible 19. A heater power supply 27 provides electric current through the resistance heater 21 to melt the charge and, thus, form a silicon melt 29 from which a single crystal 31 is pulled. Preferably, a temperature sensor 33, such as a photo cell or pyrometer, is be used to provide measurements of the melt surface temperature. The single crystal 31 starts with a seed crystal 35 attached to a pull shaft, or cable, 37. As shown in FIG. 1, single crystal 31 and crucible 19 generally have a common axis of symmetry 39. One end of cable 37 is connected to by way of a pulley 41 (see FIG. 2) to a drum 43 (see FIG. 2) and the other end is connected to a chuck (not shown) that holds the seed crystal 35 and the crystal 31 grown from the seed crystal.

During both heating and crystal pulling, a crucible drive unit 45 rotates crucible 19 (e.g., in the clockwise direction). The crucible drive unit 45 also raises and lowers crucible 19 as desired during the growth process. For example, crucible drive unit 45 raises crucible 19 as the melt 29 is depleted to maintain its level, indicated by reference character 47, at a desired height. A crystal drive unit 49 similarly rotates the cable 37 in a direction opposite the direction in which crucible drive unit 45 rotates crucible 19. In addition, the crystal drive unit 49 raises and lowers crystal 31 relative to the melt level 47 as desired during the growth process.

In one embodiment, crystal growth apparatus 13 preheats the seed crystal 35 by lowering it nearly into contact with the molten silicon of melt 29 contained by crucible 19. After preheating, crystal drive unit 49 continues to lower seed crystal 35 via cable 37 into contact with melt 29 at its melt level 47. As seed crystal 35 melts, crystal drive unit 49 slowly withdraws, or pulls, it from the melt 29. Seed crystal 35 draws silicon from melt 29 to produce a growth of silicon single crystal 31 as it is withdrawn. Crystal drive unit 49 rotates crystal 31 at a reference rate as it pulls crystal 31 from melt 29. Crucible drive unit 45 similarly rotates crucible 19 at another reference rate, but usually in the opposite direction relative to crystal 31.

A control unit 51 initially controls the withdrawal, or pull, rate and the power that power supply 27 provides to heater 21 to cause a neck down of crystal 31. Preferably, crystal growth apparatus 13 grows the crystal neck at a substantially constant diameter as seed crystal 35 is drawn from melt 29. For example, the control unit 51 maintains a substantially constant neck diameter of about five percent of the desired body diameter. Under a conventional control scheme, control unit 51 adjusts the rotation, pull and/or heating parameters after the neck reaches a desired length to cause the diameter of crystal 31 to increase in a cone-shaped manner until a desired crystal body diameter is reached. For example, the control unit 51 decreases the pull rate to create an outwardly flaring region typically referred to as the taper of the crystal.

Once the desired crystal diameter is reached, control unit 51 controls the growth parameters to maintain a relatively constant diameter as measured by apparatus 11 until the process approaches its end. At that point, the pull rate and heating are usually increased for decreasing the diameter to form a tapered portion at the end of single crystal 31. Commonly assigned U.S. Pat. No. 5,178,720, the entire disclosure of which is incorporated herein by reference, discloses one preferred method for controlling crystal and crucible rotation rates as a function of the crystal diameter. Commonly assigned U.S. Pat. No. 5,882,402, U.S. Pat. No. 5,846,318, U.S. Pat. No. 5,665,159 and U.S. Pat. No. 5,653,799, the entire disclosures of which are incorporated herein by reference, provide accurate and reliable measurements of a number of crystal growth parameters, including crystal diameter. In these patents, an image processor processes images of the crystal-melt interface to determine the diameter.

Those skilled in the art recognize that crucible 19 should be lifted during the crystal pull. Given the relatively small distance crucible 19 travels during a typical pull, it is readily seen that the crucible lifting is far less critical than the crystal pulling for reducing defects. A suitable equation for lifting crucible 19 while pulling crystal 31 involves multiplying the crystal pull rate times the ratio of the cross-sectional area of the ingot to the cross-sectional area of the crucible (measured at the melt level) times the ratio of the density of silicon in the ingot to the density of the silicon in the melt. Other crucible lift equations can also be used with the scope of the invention.

Figure 2:
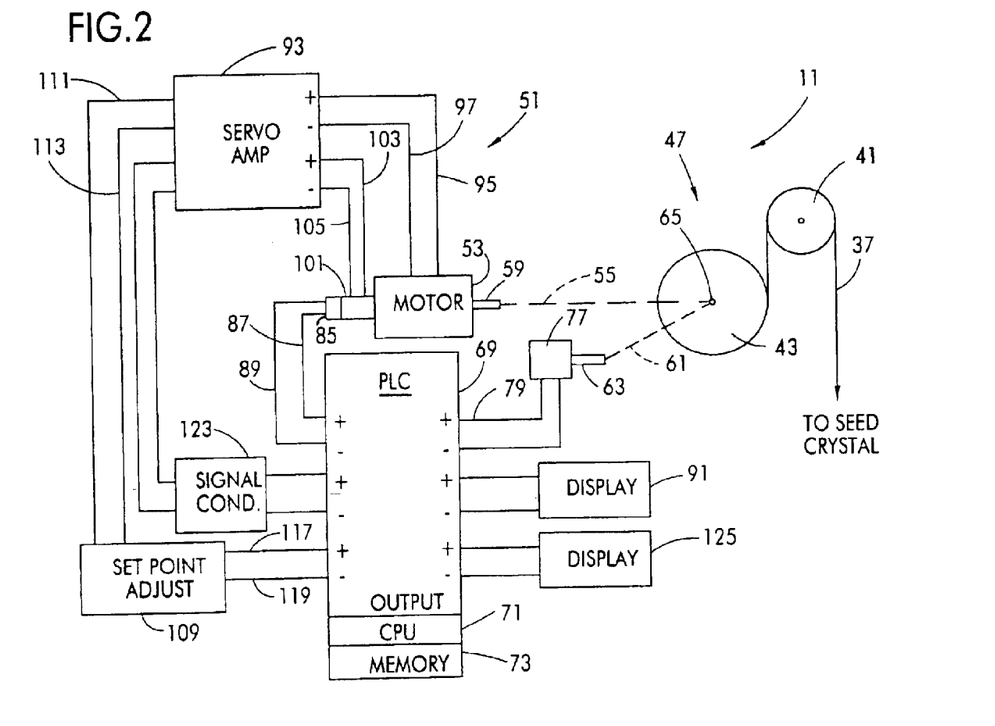
FIG. 2 is a block diagram of the apparatus of FIG. 1 including a control unit having a programmable logic controller (PLC).

FIG. 2 illustrates electrical circuitry embodying control unit 51 for controlling, among other things, crystal drive unit 49. The details of construction of crystal drive unit 49 are well known to those of ordinary skill in the art. Generally, drive unit 49 includes a motor 53 coupled to the drum 43. A dashed line 55 indicates the mechanical coupling between a shaft 59 of the motor 53 and drum 43. Although this mechanical coupling may comprise a direct connection between shaft 59 and drum 43, a preferred arrangement positions a set of reduction gears (not shown) between shaft 59 and drum 43 for better control and smoother operation. Motor 53 is thus operable to let out and reel in cable 37 via drum 43 for lowering seed crystal 35 into melt 29 and for pulling the ingot 31 from melt 29.

A dashed line 61 in FIG. 2 indicates the mounting of drum 43 on a shaft 63 through an opening 65 in drum 43. Commonly assigned U.S. Pat. No. 5,935,328, the entire disclosure of which is incorporated herein by reference, shows a drum and cable arrangement suitable for use with the present invention.

Referring further to FIG. 2, control circuit 51 includes a programmable logic controller (PLC) 69 having a central processing unit (CPU) 71 and a memory 73. The PLC 69 receives an input signal from a 500 pulse per revolution (ppr) encoder 77 via lines 79 and 81. The encoder 77 is coupled to the shaft 63 for producing a position signal. In this instance, the position signal is made up of pulses on lines 79 and 81 that vary as a function of the rotational movement of drum 43. PLC 69 thus counts the pulses on lines 79 and 81 to determine exactly how much drum 43 has rotated during any given period of interest. Encoder 77 is preferably operated in a 2x mode wherein the encoder emits 1000 discrete pulses for each 360 degree rotation of drum 43. Accordingly, if PLC 69 counts 5,500 pulses on lines 79 and 81, then it is known that drum 43 rotated exactly five and one half revolutions during the period when the pulses were generated. Alternatively, a gearing mechanism (not shown) drives drum 43 and encoder 77 can be coupled to one of the rotating gears in the gearing mechanism. Given that the gear ratios are readily known, the number of rotations of drum 43 can be calculated in a manner similar to that disclosed above.

In the illustrated embodiment, PLC 69 is also connected to a 60 ppr encoder 85 via lines 87 and 89. Encoder 85 is coupled to the shaft 59 of motor 53 and produces pulses on lines 87 and 89 as a function of the rotational movement of the shaft. The PLC 69 thus counts the pulses on lines 87 and 89 to determine exactly how much shaft 59 has rotated during any given period of interest. Encoder 85 is preferably operated in a 4x mode wherein the encoder emits 240 pulses for each 360 rotation of the shaft. Accordingly, if PLC 69 counts 480 pulses on lines 87 and 89, then it is known that the shaft 59 of motor 53 rotated exactly two complete revolutions during the period when the pulses were generated.

The PLC 69 is also programmed via conventional means with the size of drum 43 and with the gear ratios which connect shaft 59 of motor 53 to shaft 63 which turns drum 43. Given that the number of rotations of shaft 59 is known from the number of pulses on lines 87 and 89, given that the gear ratio coupling shaft 59 to drum 43 is known, and given that the diameter of drum 43 is known, PLC 69 is readily programmed via conventional means to convert the number of pulses received from encoder 85 into a numeric figure representing the linear movement of cable 37 in real time. In other words, by counting the pulses on lines 87 and 89, PLC 69 readily calculates the pull velocity of cable 37. Preferably, a display monitor 91 displays this cable velocity in real time.

A servo amplifier 93 is connected to the motor 53 via lines 95 and 97 and to a tachometer 101 via lines 103 and 105 in a conventional closed loop feedback arrangement. The tachometer 101 produces an analog signal on lines 103 and 105 which varies in voltage as a function of the rotational speed of the shaft 59 of motor 53. The servo amplifier 93 receives the analog voltage signal on lines 103 and 105. Servo amplifier 93 also receives a set point signal from a set point adjusting circuit 109 via lines 111 and 113. For example, the set point adjusting circuit 109 comprises a DC to DC convertor. PLC 69 controls set point adjusting circuit 109 and, hence, the set point signal via lines 117 and 119, as explained more fully below. In this manner, PLC 69 controls the speed of motor 53.

More particularly, servo amplifier 93 responds to the set point signal on lines 111 and 113 by producing a current signal which is supplied to motor 53 via lines 95 and 97. The current signal energizes the motor and determines its speed. Servo amplifier 93 then uses the analog voltage signal received from tachometer 101 to determine whether motor 53 is operating at the speed which corresponds to the set point signal. If not, servo amplifier 93 adjusts the current signal up or down, as the case may be, until the analog voltage signal from tachometer 101 indicates that:motor 53 is operating at the speed set by the set point signal. Again, since PLC 69 controls the set point signal via lines 117 and 119, PLC 69 controls the speed of motor 53.

The PLC 69 is also connected to a signal conditioning circuit 123. Signal conditioning circuit 123 is connected to servo amplifier 93 for receiving and conditioning the analog voltage signal produced by tachometer 101. PLC 69 receives the conditioned analog voltage signal from circuit 123 and converts it to a numeric value corresponding to the pull velocity of cable 37. PLC 69 displays this numeric value via a display 125.

Although it is seen that the actual pull velocity of cable 37 is redundantly displayed on displays 91 and 125, those skilled in the art will recognize that display 91 can display the reported velocity with far greater accuracy than display 125. This is because the source of the data underlying the velocity reported on display 91 is the highly precise and accurate encoder 85 operating in the 4× mode. By contrast, the underlying data for the velocity reported on display 125 is the analog signal produced by tachometer 101. Such a signal is inherently less accurate and is subject to substantial temperature variations, among others. In short, the present invention could readily be practiced without display 125.

Given sufficient cooling time, perfect silicon can be produced provided that the ratio of the growth rate or velocity, v, and the average axial temperature gradient, G, is within some tolerance, T, of a critical value, (v/G)cr. This tolerance may be defined by:

$$T = \frac{1}{2} \frac{\Delta(v/G)}{(v/G)}$$

where Δ(v/G) is the range of values of v/G for which perfect silicon can be produced.

The tolerance depends strongly on the cooling conditions provided by a given hot zone. Specifically, T increases with increasing cooling time before nucleation. Data collected for a variety of hot zones suggest a value of T=0.055 as a preferred tolerance. Reexpressing:

$$|T| = \left|\frac{\Delta v}{v}\right| + \left|\frac{\Delta G}{G}\right|$$

However, G is generally difficult to control. If G does not vary, the maximum error in v for ensuring perfect silicon growth could be |T|. For a robust process, a much smaller variation of v is preferred (e.g., 10% of |T|).

Figure 3:
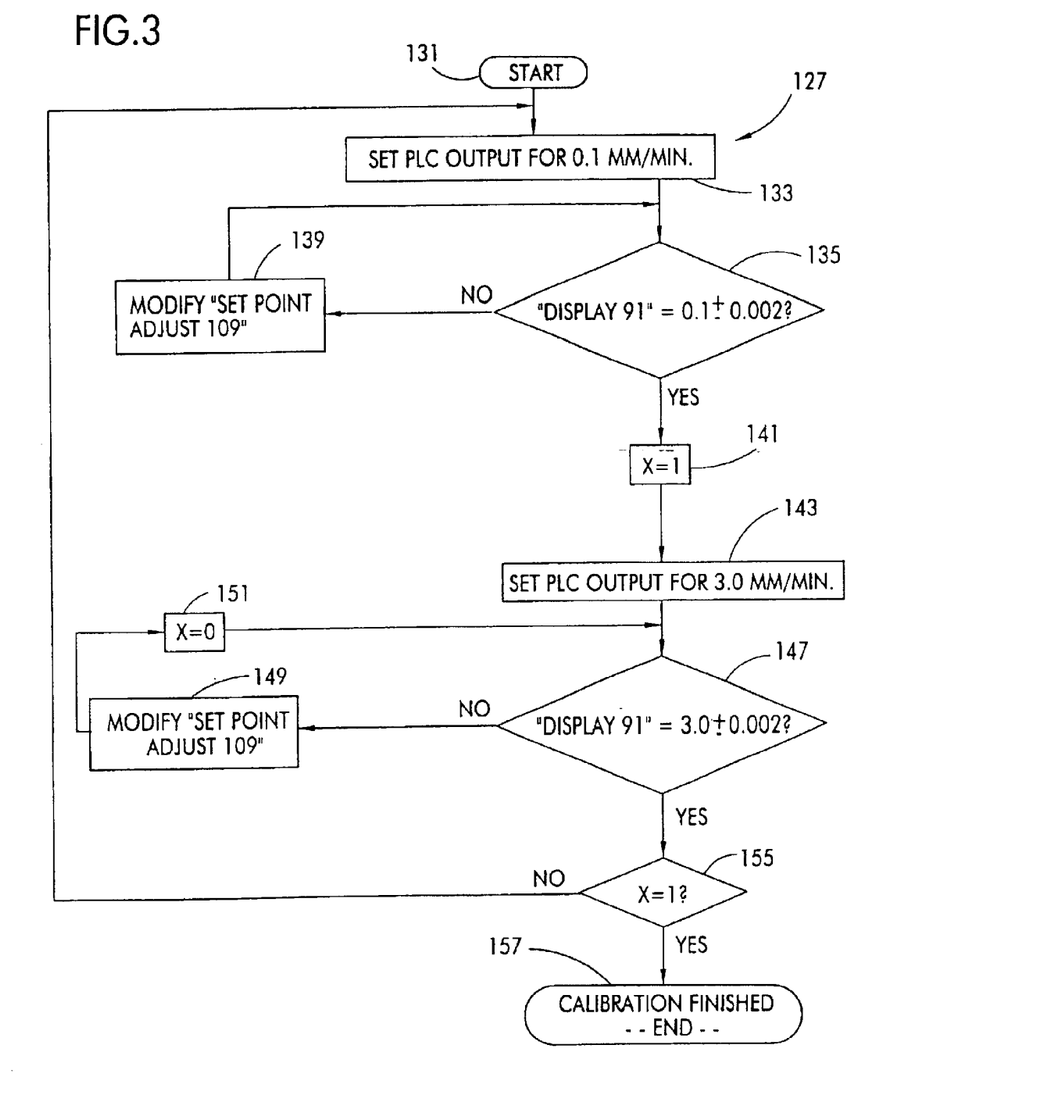
FIG. 3 is a flow diagram illustrating the operation of the control unit for calibrating the apparatus of FIG. 1.

FIG. 3 shows a flow chart, generally indicated at 127, for calibrating apparatus 11 of FIG. 2. Beginning at step 131, the flow chart 127 immediately proceeds to step 133 wherein an operator adjusts external controls (not shown) on PLC 69 for a nominal cable velocity of 0.1 mm/min. At step 135, the operator observes the cable velocity reported on display 91. If the reported velocity is not within 0.002 mm/min. of 0.1 mm/min. (ie., 0.1±0.002 mm/min.), then the operator proceeds to step 139. The operator "tweaks" the offset parameter for set point adjusting circuit 109 at step 139 and then returns to step 135. If the displayed cable velocity is still not 0.1±0.002 mm/min., the operator continues tweaking the offset parameter for circuit 109 until the reported cable velocity on display 91 is equal to 0.1±0.002 mm/min. At this point, the operator proceeds to step 141 for assigning a value of "1" to a variable, x, to indicate that step 135 was successfully accomplished.

The flow chart 127 continues with step 143 where the operator of apparatus 11 adjusts the external controls on PLC 69 for a nominal cable velocity of 3.0 mm/min. At step 147, the operator again observes the cable velocity reported on display 91. If the reported velocity is not equal to 3.0±0.002 mm/min., then the operator proceeds to step 149 for tweaking the gain parameter of set point adjusting circuit 109. In this instance, the variable, x, is set to zero at step 151 before the operator returns to step 147. At step 147, the operator reads display 91 again to see whether it now reports a cable velocity of 3.0±0.002 mm/min. If not, the operator continues tweaking the gain parameter for circuit 109 at step 149 until the reported cable velocity on display 91 is equal to 3.0±0.002 mm/min. At this point, the operator proceeds to step 155. Flow diagram 127 returns to step 133 since the variable, x, is zero instead of one. In this manner, the operator continues finely calibrating the circuitry. This calibration continues until PLC 69 can be switched between nominal settings of 0.1 and 3.0 mm/min. with the result that the actual cable velocity is equal to these nominal settings ±0.002 mm/min. (and without any further tweaking of circuit 109). At this point, the variable, x, will remain at a value of one and, thus, allow the operator to proceed to step 157 where the calibration successfully concludes.

Figure 4:
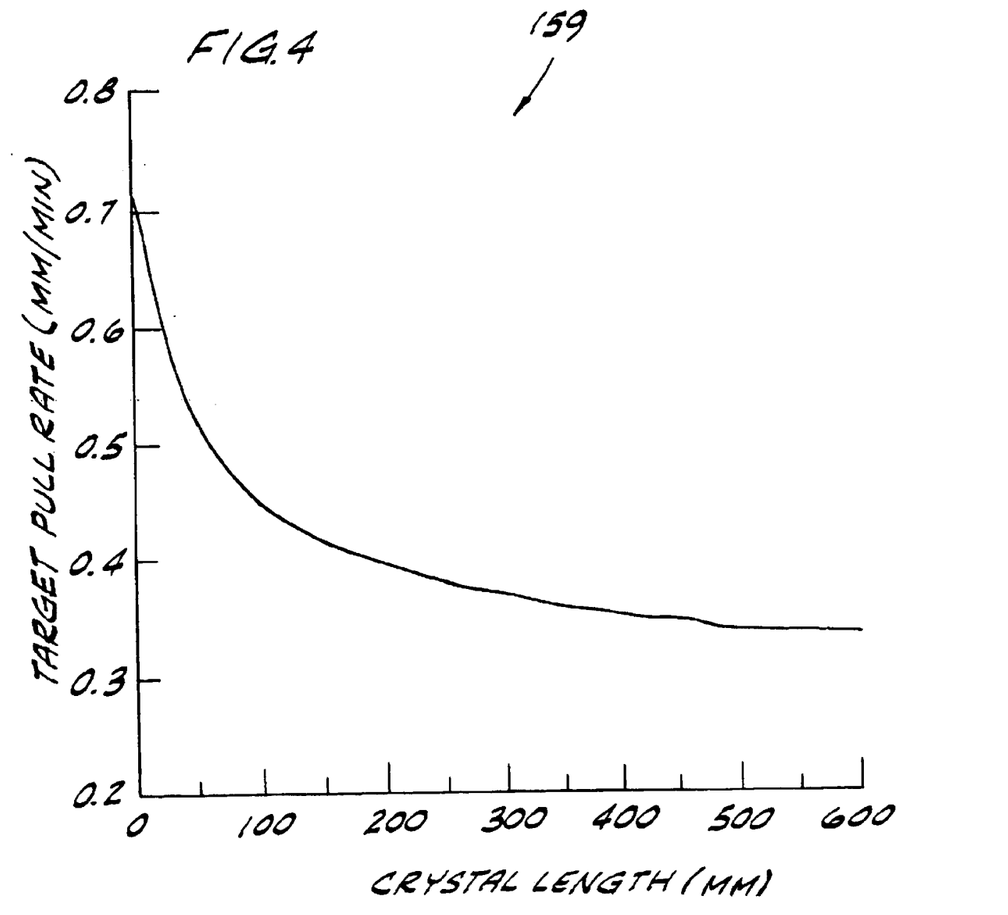
FIG. 4 is a velocity profile for pulling a crystal ingot having a reduced number and concentration of intrinsic point defects with the apparatus of FIG. 1.

FIG. 4 shows an exemplary velocity profile, indicated generally at 159, for pulling single crystal silicon ingot 31. Accurately pulling the crystal 31 from melt 29 according to a predetermined velocity profile, or target, specified in a crystal. "recipe" helps satisfy process needs for controlling the formation of defects. This type of "locked seed lift" control reduces the number and concentration of intrinsic point defects in the ingot. In addition, a locked seed lift process helps control the concentration of vacancies and self-interstitials to prevent an agglomeration of intrinsic point defects in crystal 31 as the ingot cools from the solidification temperature. It is to be understood that those skilled in the art will recognize that the present invention can be practiced with any suitable velocity profile.

The velocity profile 159 defines a target pull rate as a function of the length of crystal 31 during the pull. According to a preferred embodiment of the invention, pulling crystal 31 according to velocity profile 159 produces silicon with a nearly perfect crystalline structure and having very few intrinsic point defects. The concentration of intrinsic point defects in such silicon at the time of solidification would certainly be well below the level of critical supersaturation making it very unlikely that an agglomeration event would occur. Such control of the concentration of vacancies and self-interstitials to prevent an agglomeration of intrinsic point defects in the ingot as the ingot cools from the solidification temperature is very desirable. Commonly assigned U.S. Pat. No. 5,919,302, the entire disclosure of which is incorporated herein by reference, provides further information concerning the velocity profile of FIG. 4 and the production of silicon having a nearly perfect crystalline structure.

In use, the velocity profile 159 of FIG. 4 is stored in the memory 73 of PLC 69. Profile 159 could also be stored in the registers or related memory circuits of CPU 71 within the scope of the invention. Those skilled in the art will recognize that the velocity profile 159 of FIG. 4 is shown here for exemplary purposes and that the present invention can be practiced with any suitable velocity profile.

In the course of working with velocity profiles such as profile 159 of FIG. 4, it has been found important that the pull rate of crystal 31 follow the velocity profile very accurately at all crystal lengths during the pull. Preferably, apparatus 11 controls the pull rate of crystal 31 so that it follows velocity profile 159 within about 0.008 mm/min or less for the majority of the crystal length. In other words, the pull rate is approximately equal to the target rate. Although the present may be practiced where the pull rate of crystal 31 follows the velocity profile accurate to within ±0.008 mm/min., ±0.006 mm/min. or ±0.004 mm/min., or even to within ±0.002 mm/min, it is to be understood that the best results are attained with an accuracy of ±0.002 mm/min. or better and that accuracy even better than ±0.002 mm/min falls within the scope of the invention.

In a preferred embodiment of the invention, PLC 69 uses a 12 bit digital to analog card for producing the control signal for the set point adjusting circuit (i.e., circuit 109 in FIG. 2). Those skilled in the art will recognize that changes can be made within the scope of the invention to improve the accuracy of the present embodiment. For example, the use of a 14 bit card, instead of a 12 bit, should result in improved accuracy.

Figure 5:
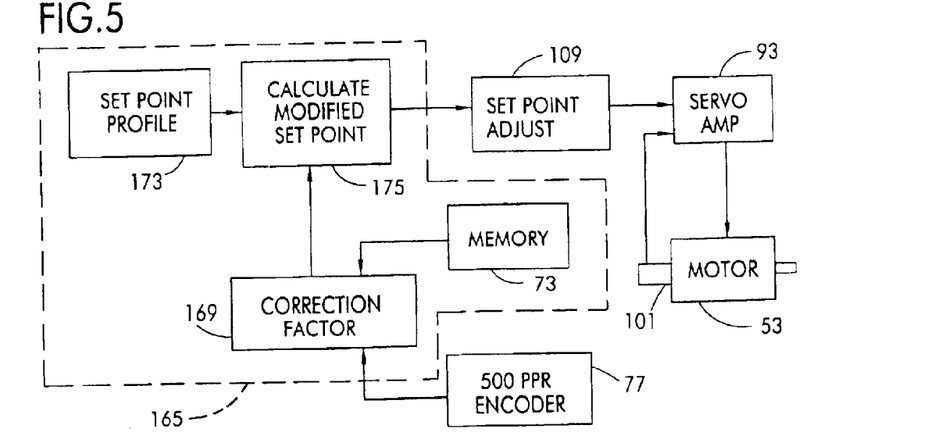
FIG. 5 is a block diagram of the apparatus of FIG. 1 operating to calculate a modified set point.

FIG. 5 is a block diagram showing how PLC 69, once loaded with profile 159, controls the rate of a crystal pull accurate to within ±0.002 mm/min. of profile 159 throughout the pull. Preferably, PLC 69 performs the functions within a dashed line 165. More particularly, PLC 69 calculates the actual pull rate from the output of encoder 77 and compares it to what is expected to occur, that is, the target rate defined by the velocity profile 159 stored in memory 73. PLC 69 then uses the difference between the expected results and the actual results to calculate a correction factor 169. PLC 69 calculates a set point 173 by determining the point along the velocity profile 159 at which the pull is then occurring. By multiplying the correction factor 169 times the set point 173, PLC 69 thus calculates a modified set point 175. PLC 69 outputs the modified set point 175 to the set point adjusting circuitry 109 to control the rate of the crystal pull. As explained above, adjusting the set point in this manner keeps the crystal pull rate within ±0.002 mm/min. of profile 159 throughout the pull.

Figure 6A:
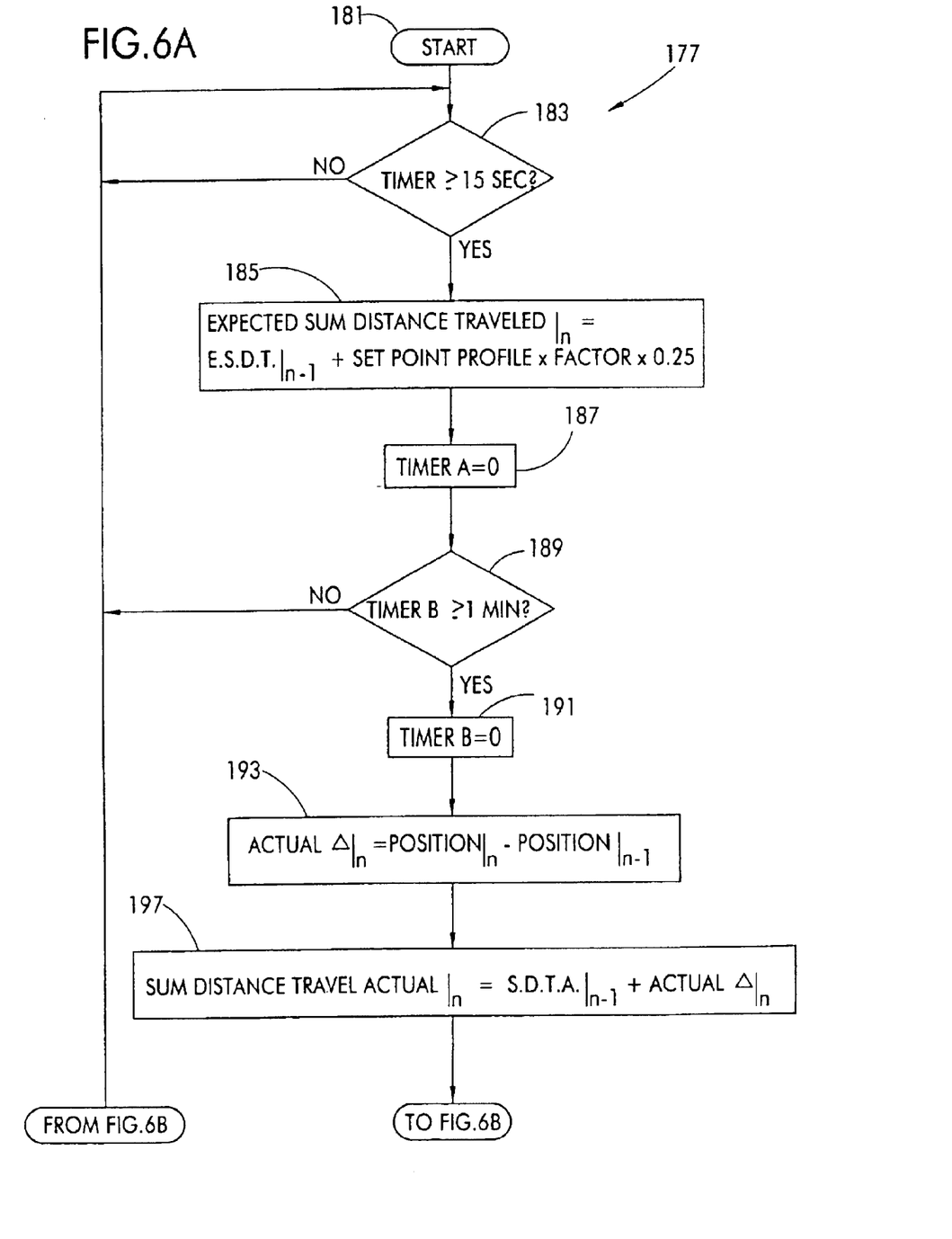
FIGS. 6A and 6B are a flow diagram illustrating the operation of the PLC of FIG. 2 for calculating a correction factor.
Figure 6B:
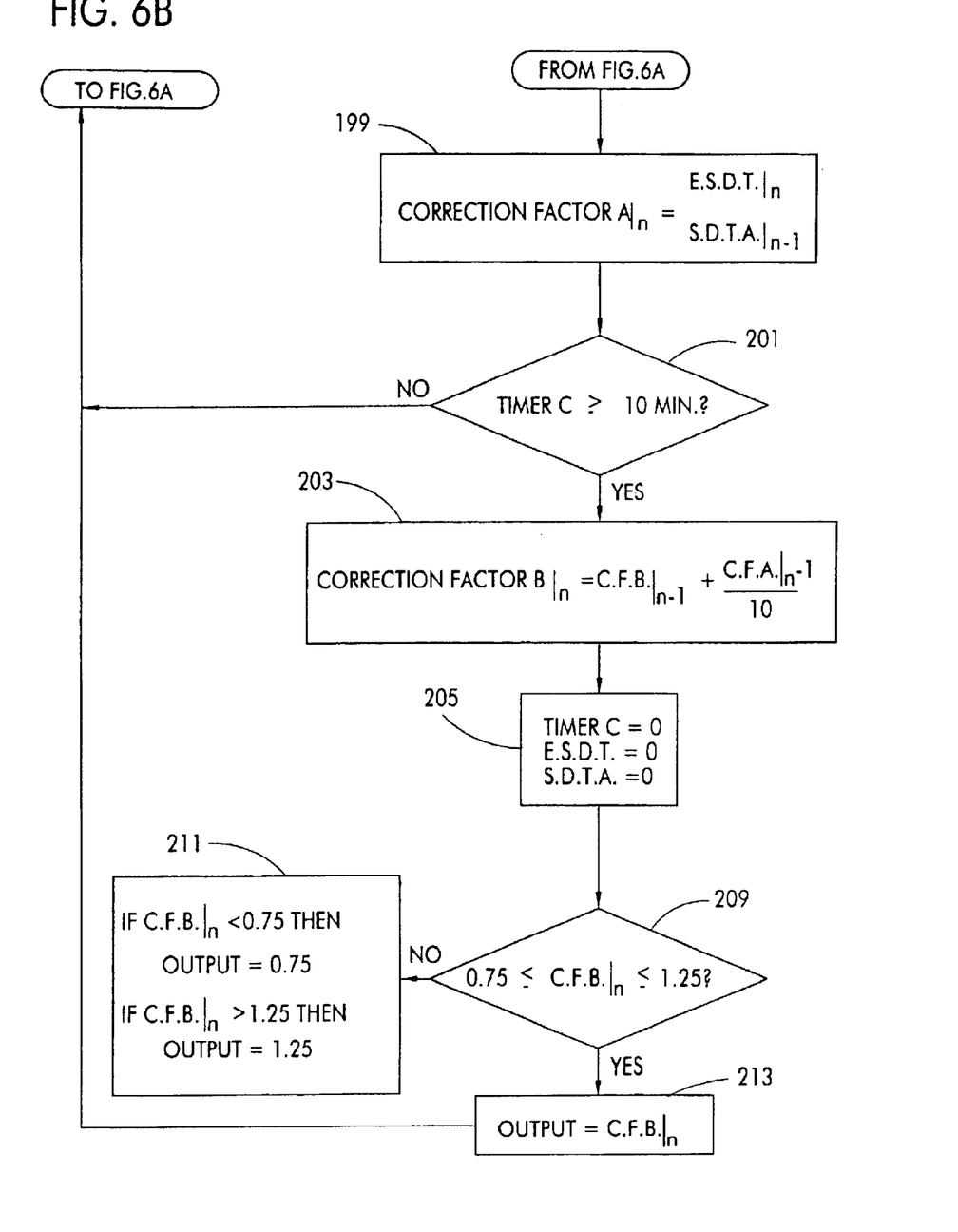

FIGS. 6A and 6B show a flow chart, indicated generally at 177, providing greater detail on the operation of PLC 69. In particular, the flow chart 177 illustrates how PLC 69 calculates the correction factor 169 of FIG. 5. Flow chart 177 begins at step 181 and immediately proceeds to step 183. At step 183, PLC 69 tests whether a predetermined interval of time (e.g., 15 seconds) has elapsed since the last time an "expected sum distance traveled" (E.S.D.T.) variable was updated. If the 15 second interval has not expired, PLC 69 repeats step 183 until it has. After 15 seconds expire, PLC 69 proceeds to step 185.

At step 185, PLC 69 updates E.S.D.T. by adding the incremental distance that it expected crystal 31 to have been pulled since the last update to the existing E.S.D.T. value. It is noted that the "set point profile" is the instantaneous expected crystal pull rate determined from velocity profile 159 as a function of crystal length. It is also noted that the "factor" identified in step 185 is a factor which, depending on the setup, may be adjusted slightly to move melt level 47 relative to the pull or to keep the pull of crystal 31 substantially constant relative to melt level 47. Commonly assigned application Ser. No. 09/172,546, filed Oct. 14, 1998, the entire disclosure of which is incorporated herein by reference, discloses these considerations more fully. The factor of step 185 may also be adjusted near the end of a crystal pull as melt 29 is being depleted from crucible 19. Throughout most of the crystal pull when melt level 47 is fairly constant, the factor of step 185 preferably has a numeric value of "one." Finally, the 0.25 multiplier in step 185 is used since the relevant period of time is 15 seconds or 0.25 minutes.

After updating the E.S.D.T. value, PLC 69 resets Timer A at step 187 and proceeds to step 189 for determining whether another predetermined interval of time (e.g., one minute) has passed since the last time a Correction Factor A (C.F.A.) was updated. If the one minute interval has not so passed, the process returns to the beginning and waits for the 15 second interval to again update E.S.D.T. When one minute finally passes, PLC 69 resets Timer B to zero at step 191 and then proceeds to step 193. At step 193, PLC 69 determines how many pulses encoder 77 produced since the last update. Knowing the diameter of drum 43, PLC 69 converts this incremental pulse count to the incremental distance crystal 31 was pulled as explained above. This incremental value is equal to the "actual delta(n)" value to conclude step 193.

Proceeding to step 197, PLC 69 calculates the distance crystal 31 has been pulled to present as represented by a "sum distance travel actual" variable (S.D.T.A.). PLC 69 updates the S.D.T.A. value by simply adding its old value to the "actual delta(n)" value calculated in the immediately preceding step 193.

Referring now to FIG. 6B, flow diagram 177 continues at step 199. At step 199, PLC 69 calculates a first correction factor, Correction Factor A (C.F.A.), by dividing the current E.S.D.T. by the current S.D.T.A. PLC 69 proceeds to step 201 for determining whether a third predetermined interval of time (e.g., 10 minutes) has passed since the last time a second correction factor, Correction Factor B (C.F.B.), was updated. If the 10 minute interval has not expired, the process returns to step 183 and waits for the 15 second interval to update the E.S.D.T. value again. When ten minutes has finally passed, PLC 69 updates C.F.B. at step 203 by subtracting one from the current C.F.A., then dividing the result by ten and adding that to the previous C.F.B. PLC 69 then proceeds to step 205 where it resets Timer C, E.S.D.T., and S.D.T.A. to zero.

Preferably, the C.F.B. value is relatively close to one. For this reason, PLC 69 tests at step 209 whether the current C.F.B. is greater than or equal to 0.75 or less than or equal to 1.25. If C.F.B. is within this range, PLC 69 outputs a current C.F.B at step 211 as the correction factor 169 in FIG. 5 before returning to the beginning of flow chart 177. If C.F.B. is outside this range, however, PLC 69 sets C.F.B. at step 213 depending on whether the current value is too high or too low. If the current C.F.B. is too low, PLC 69 outputs 0.75 as correction factor 169 but if it is too high, PLC 69 outputs 1.25 as correction factor 169. PLC 69 then returns to the beginning of flow chart 177.

As described above, accurately pulling single crystal silicon ingot 31 from melt 29 according to a predetermined velocity profile, or target, specified in a crystal "recipe" helps satisfy process needs for controlling the formation of defects. Conventional Czochralski silicon growth processes, however, vary the pull rate, or seed lift, to control the diameter of the growing crystal 31, which causes problems in a "locked seed lift" process. Those skilled in the art recognize that increasing pull rate causes a reduction in crystal diameter while decreasing the pull rate causes an increase in diameter. It is also well known that increasing in the temperature of the silicon source melt 29 causes a reduction in crystal diameter while decreasing the melt temperature causes an increase in diameter. For these reasons, controlling the pull rate according to a target profile can lead to large diameter errors or lack of diameter control unless the melt temperature is accurately adjusted during pulling.

Figure 7:
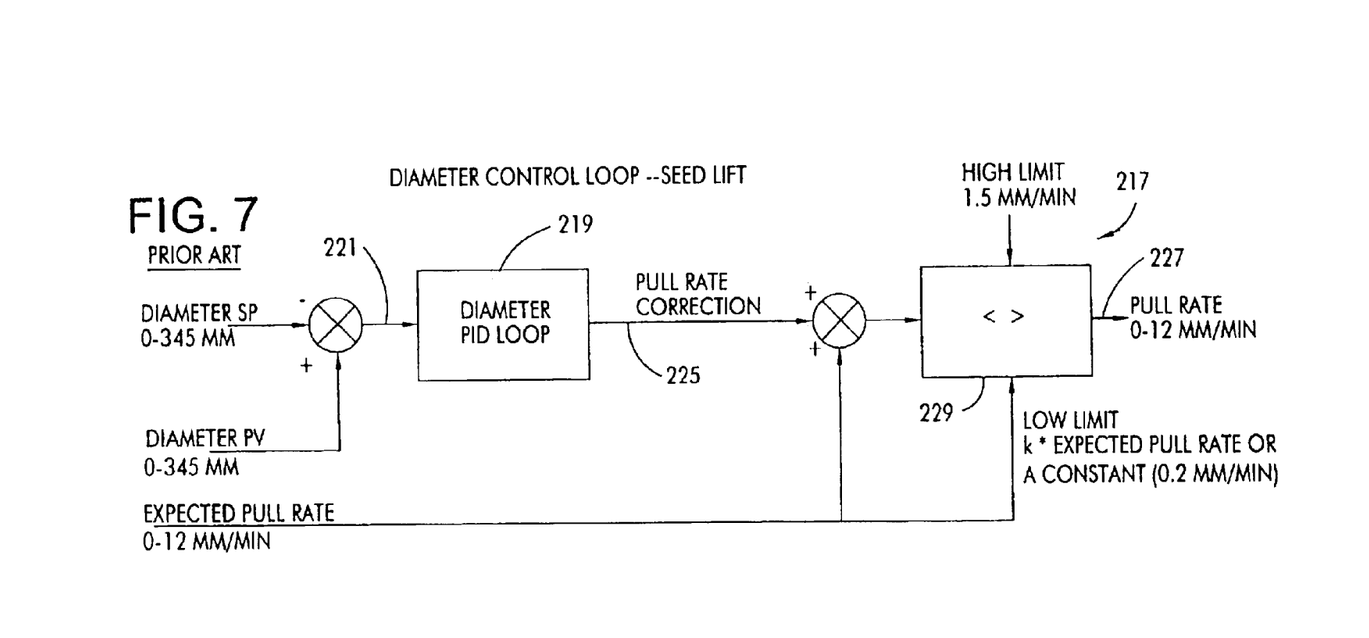
FIGS. 7, 8, and 9 are block diagrams illustrating control of the crystal growth process according to the prior art.

FIG. 7 illustrates a diameter control loop, generally indicated at 217, in accordance with the prior art. As shown in FIG. 7, a proportional-integral-derivative (PID) control loop 219 receives an error signal at line 221. The error signal represents the difference between the desired, or target, crystal diameter (i.e., the set point) and the actual crystal diameter (i.e., the process variable). The PID loop 219 outputs a pull rate correction at line 225 for adjusting the expected pull rate, which is obtained from the particular crystal growing recipe. The control loop 217 outputs a seed lift set point at line 227 for adjusting the pull rate to change the crystal diameter. In FIG. 7 control loop 217 also includes a limiter 229 for preventing the seed lift set point from changing by too large of an amount. As shown, the control loop 217 of FIG. 7 requires changing the seed lift to effect changes in the diameter of ingot 31.

Figure 8:
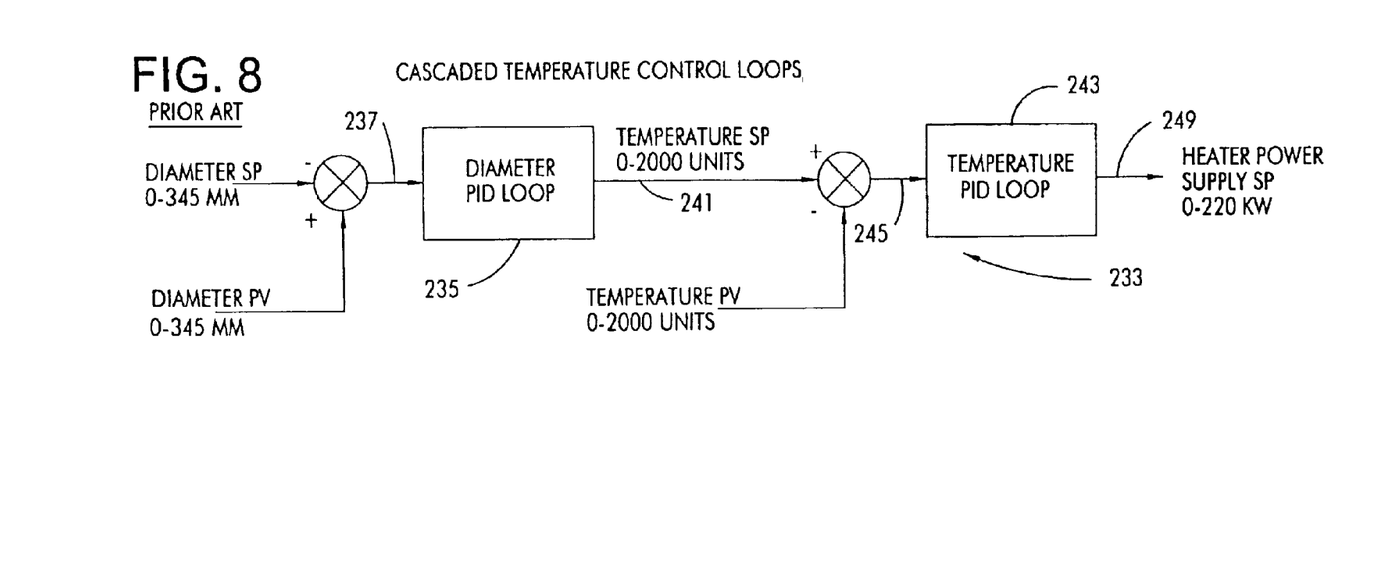

FIG. 8 shows a conventional cascaded temperature control, generally indicated at 233, for crystal growing apparatus 13. In active seed lift applications, in which the controller varies the pull rate to control diameter, the set point is usually the target seed lift and the process variable is usually the actual seed lift. As shown in FIG. 8, a primary PID control loop 235 receives an error signal at line 237 representing the difference between the crystal diameter set point and the crystal diameter process variable. The PID loop 235 outputs a temperature set point at line 241. In turn, a secondary PID control loop 243 receives an error signal at line 245. The error signal at line 245 represents the difference between the temperature set point and the actual temperature (i.e., the process variable). In this instance, however, the secondary PID loop 243 receives heater temperature feedback from pyrometer 33 or a thermocouple (not shown) near the insulation package of crystal growing apparatus 13. In other words, conventional crystal pullers often do not examine the actual temperature of silicon melt 29 so errors are introduced to the control 233. The PID loop 243 outputs a heater power supply set point at line 249 to change the crystal diameter. The advantage of the cascaded scheme of control loop 233 is that the secondary loop involving PID 243 can be tuned to respond relatively quickly to changes in heater temperature set point such that the power will typically overshoot its final, steady state value. This relatively rapid change in heater power and temperature improves the overall response of the system. However, it does not necessarily improve the diameter response to power changes because a dominant lag remains in the melt mass. Moreover, in practice, the pyrometer window often becomes dirty or obstructed or the thermocouple measures a different portion of the insulation package. This can result in significant gain and offset variability from run to run and from puller to puller. As a result, predetermined temperature profiles cause variability in both crystal quality and throughput. Further, diameter control is generally unacceptable with conventional control loop 233 due to the slow response speed and the variability in the melt surface to heater temperature relationship.

Figure 9:
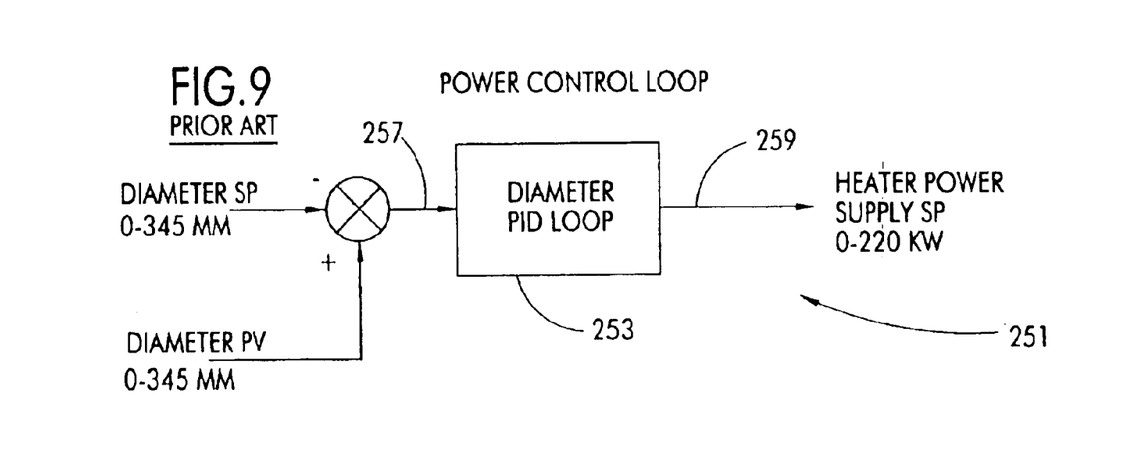

FIG. 9 illustrates yet another conventional power control loop, generally indicated at 251. In this instance, the control scheme of loop 251 is somewhat slower than the cascade scheme of control loop 233 but does not require a secondary PID loop, such as PID 235, for heater temperature. A PID control loop 253 receives an error signal at line 257. The error signal represents the difference between the crystal diameter set point and process variable. The PID loop 251 outputs a heater power supply set point at line 259 for adjusting the melt temperature to control diameter. In control loop 251, heater power tends to be very repeatable from run to run and, to a lesser extent, from puller to puller. When compared to the control schemes of FIGS. 7 and 8, control loop 251 provides improved crystal quality and throughput and eliminates run failures due to pyrometer and thermocouple measurement failures. The power control loop 251, however, has such a slow response time that this scheme is unacceptable for diameter control. Those skilled in the art recognize that the PID gains plus the dynamics of the process determine the output of the control loops (i.e., pull rate correction, temperature set point or power supply set point).

Figure 10:
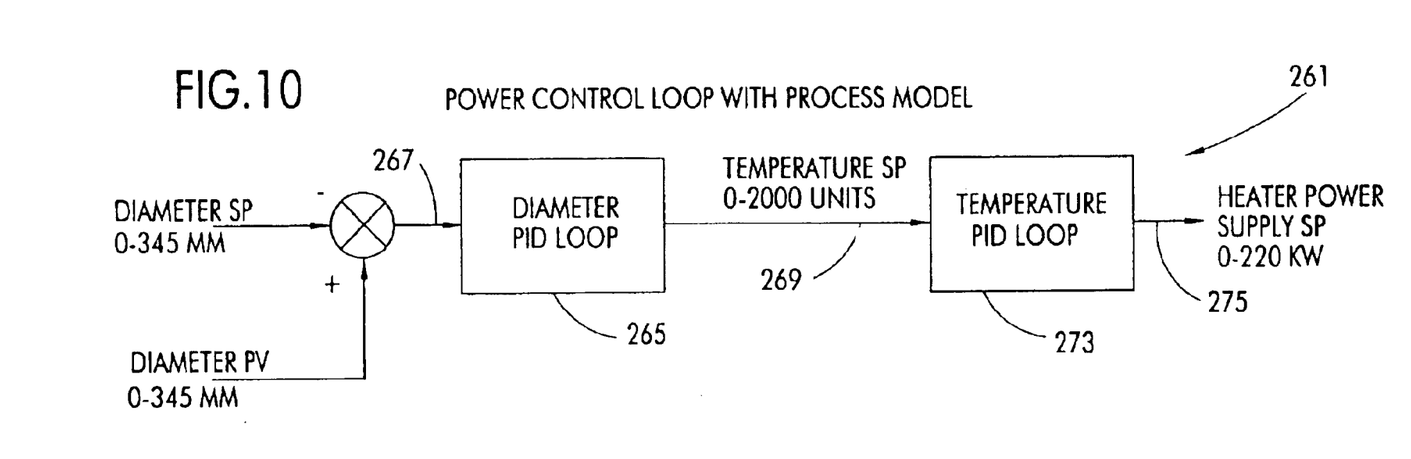
FIG. 10 is a block diagram illustrating control of the crystal growth process according to a preferred embodiment of the present invention.

Referring now to FIG. 10, a power control loop, generally indicated at 261, embodies aspects of the present invention for controlling crystal diameter in a locked seed lift process. A PID control loop 265 receives an error signal at line 267 representing the difference between the crystal diameter set point and the crystal diameter process variable. In turn, the PID loop 265 outputs a temperature set point at line 269. According to the invention, the control loop 261 includes a temperature model 273, which receives the temperature set point and outputs a heater power supply set point at line 275 to effect desired changes in the crystal diameter. In a preferred embodiment of the invention, the temperature model 273 estimates the relationship between heater power and the temperature of the surface of silicon melt 29. It is contemplated that temperature model 273 may be used to provide a model of diameter slope, that is, the rate of diameter change. In general, pyrometer measurements of the melt surface temperature provide data for generating temperature model 273. Although controlling crystal diameter by controlling the melt temperature is generally not as robust as controlling by pull rate, control loop 261 advantageously provides the benefits of a locked seed lift process with faster, accurate diameter control.

Figure 11:
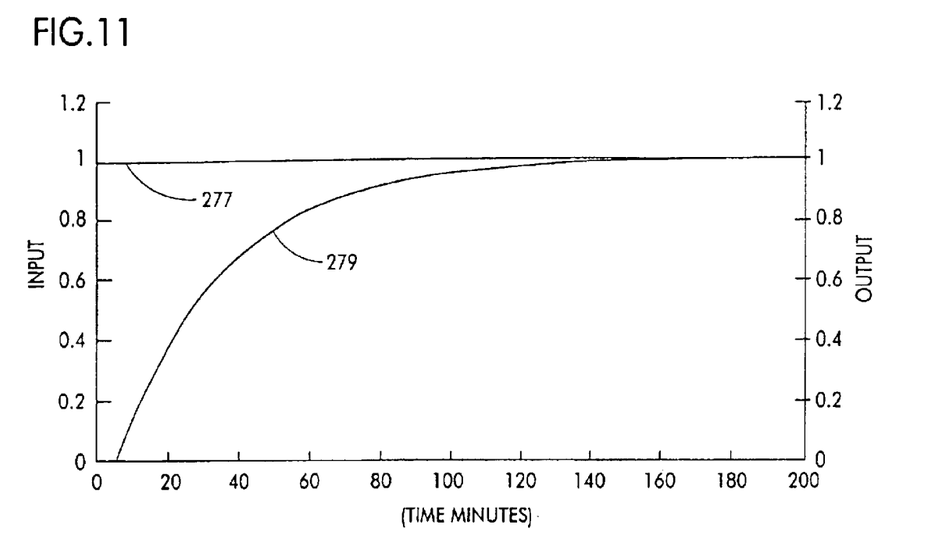
FIG. 11 is an exemplary temperature response model for the controls of FIGS. 7–9.

A simplified model of the relation of heater power to melt surface temperature includes a dead time, gain and first-order lag. FIG. 11 illustrates an exemplary temperature response for a conventional control scheme such as one shown in FIG. 8 or 9. In FIG. 11, a unity step input 277, beginning at time t=1, results in an output 279 approximated by an exponential function:

$$f(t) = 1 - \exp(-(t-t_d)/\tau)$$

In the example of FIG. 11, the output 279 follows a dead time of $t_d$=5 minutes and consists of a first-order lag with a time constant of $\tau$=30 minutes. During the dead time, or delay period, there is no response to input 277. The lag of output 279 results in an exponential change to a final value (e.g., a final temperature), the speed of response being determined by its time constant, $\tau$.

Figure 12:
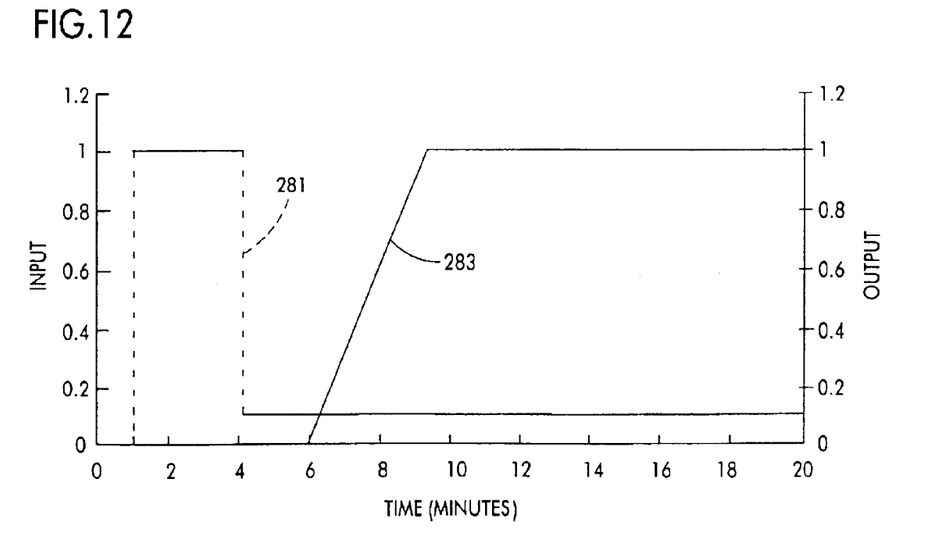
FIG. 12 is an exemplary temperature response model for the control of FIG. 10.

FIG. 12 illustrates an exemplary temperature response for the control loop 261 shown in FIG. 10. A "power gap" is useful in achieving relatively large changes in melt temperature. An input 281 in the form of a pulse of power having a predetermined amplitude and duration, and which is followed by a steady state power change, provides such a power gap. The input 281, beginning at time t=1, results in an output 283 approximated by an exponential function:

$$f(t) = k^*(1 - \exp(-(t-t_d)/\tau))$$

As before, the output 283 follows a dead time ($t_d$=5 minutes) during which there is no response. Output 283 also has a first-order lag with a time constant of τ=30 minutes. The multiplier k defines the pulse amplitude as a function of the steady state power change. To achieve a response equal to the steady state response (e.g., unity), the pulse is applied for a duration defined by:

$$t = -\tau * \ln(1 - 1/k)$$

Note that dead time is not included since output 283 does not respond to input 281 until completion of the dead time. It is simply delayed. As an example, τ32 30 minutes and k=10 so that the pulse duration is 3.16 minutes. Thus, 3.16 minutes following the dead time, the temperature is expected to reach the desired level and be maintained at that level by the steady state power value. The temperature model of FIG. 12 advantageously results in a successful control of crystal diameter in which power changes can be made at intervals roughly equal to the process dead time.

FIGS. 11 and 12 provide a comparison of the step response and the pulse response. In FIG. 12, however, the output 283 rises (according to the exponential function) relatively rapidly due the power pulse of input 281 and achieves the desired magnitude in a fraction of the time that it takes output 279 of FIG. 11 to reach the desired magnitude. The diameter of the growing ingot 31 and its rate of change determine the magnitude of the power pulses as well and the steady state power changes.

Preferably, PLC 69 executes software implementing temperature model 273 (as developed by the temperature response of FIG. 12). The diameter control loop 261 provides control action via PID 265 to generate the temperature set point that causes the pulses to be automatically generated. This set point is expressed in terms of dimensionless temperature units that have been scaled to heater power (e.g., 10#'s/kW). For example, if the PID controller 265 sends model 273 a change in set point of 5#'s, a pulse of 5 kW (i.e., 10*5#'s*1 kw/10#'s) for 3.16 minutes results, followed by a steady state power change of 0.5 kW. The factor k (k=10) causes the power to overshoot (similar to the cascade control scheme 233 of FIG. 8) but the factor k and the pulse duration are calculated to achieve a desired step change in temperature rather than in heater temperature. The rate of change of diameter (i.e., slope) responds quickly to this melt surface change. In order to reduce the effect of dead time, the PID sample rate is set to a value approximately equal to that of the dead time, which in this example is 5 minutes. This results in the action of the controller becoming effective on the following cycle. The repeated corrective actions taken by PID loop 265 compensate for inaccuracies in the model. This results in significantly improved response time to diameter error over that of cascade control 233 plus eliminates the variability and unreliability caused by heater temperature measuring elements such as pyrometers and thermocouples.

As an example, crystal growing apparatus 13 is a Ferrofluidics CZ-150 Crystal Puller, which provides a control system hardware configuration suitable for carrying out the present invention. The program executed by PLC 69 of control unit 51 preferably includes temperature model 273 in its temperature control calculations. As described above, temperature model 273 calculates power pulses to achieve the desired melt temperature changes. The model function is initialized when the puller mode is providing power control for melting and stabilizing melt 29. In general, direct control of heater power is desired during this mode. During power control, the temperature set point and process variable are set to mid-range (e.g., 1000 units) while the heater power is being manipulated. After the temperature mode is selected, the temperature set point is initialized to 1000 units and can be manipulated. It is then used to calculate the heater power, which has been initialized to the last value selected in the power control mode.

When power control loop 261 is being used to control melt temperature, PLC 69 runs the model calculations at regular intervals (e.g., every 6 seconds or 0.1 minute). Each time PLC 69 runs the calculations, a shift register stores the current temperature set point. The shift register terminates the power pulses at the end of their programmed duration. According to the invention, PLC 69 executes the following equation to calculate the power output:

$$P_1 = P_0 + G * \left[ k * \sum_{n=0}^{i} T_n - (k-1) * \sum_{n=0}^{i} T_{n-m} \right]$$

where:
  $P_1$ is the current power;
  $P_0$ is the initial power at start of the temperature control mode;
  G is the conversion from temperature units to kW (e.g., 10#'s/kW);
  k is the pulse amplitude;
  $T_n$ is the temperature set point at time t=n; and
  $T_{n-m}$ is the temperature set point at time t=n-m where m is the pulse duration in samples (e.g., 32 samples at 0.1 minutes per sample).

In a preferred embodiment of the invention, a combination of active and locked seed lift control strategies provides robust crystal control. As described above, diameter control loop 217 sums the expected pull rate with the pull rate correction output by PID loop 219 at line 225. During the early growth of the crystal ingot 31, proportional and derivative action are tuned for effective diameter control by varying seed lift. Integral action is not used to ensure that diameter error is not completely eliminated by seed lift values caused by the accumulation of diameter error. The objective of the active seed lift scheme of FIG. 7 is to control relatively large diameter upsets, which often occur over the shoulder portion of crystal 31, by adjusting the seed lift, or pull rate. Simultaneously, the melt temperature may be adjusted through fast PID tuning to also reduce the initial diameter error. After growing the first 50 mm, for example, of crystal ingot 31, the temperature of melt 29 and the crystal diameter are expected to be relatively stable and in control. At this time, control preferably transitions from an active seed lift phase to a locked seed lift phase. The PID loop 265 of power control loop 261 provides correction for the diameter error not corrected by adjusting seed lift. The PID gains in the seed lift loop 217 revert to zero and the PID gains in the power control loop 261 are set to the appropriate values for the remainder of the ingot growth.

Figure 13:
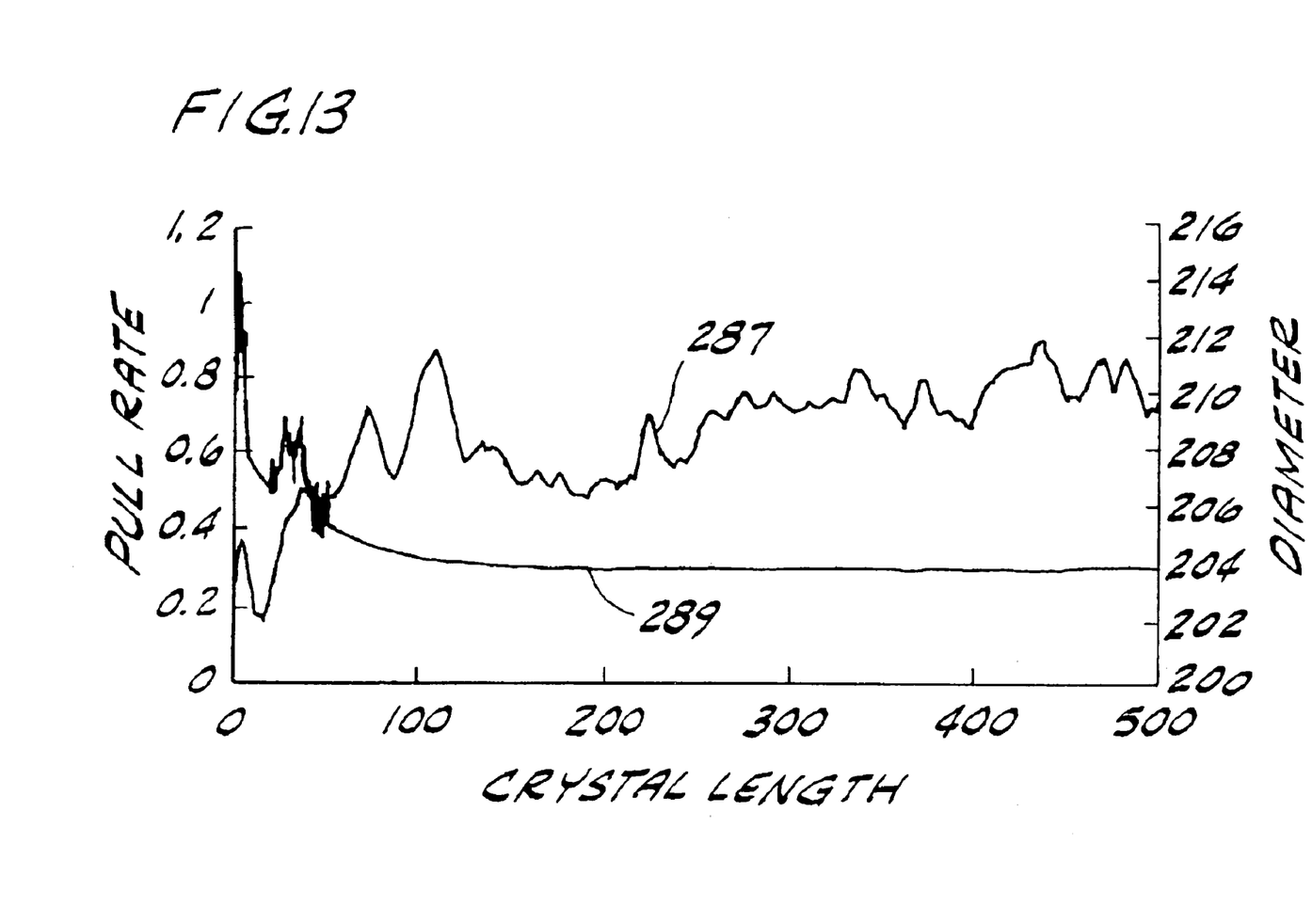
FIG. 13 is an exemplary graph illustrating diameter performance with active and locked pull rate according to the apparatus of FIG. 1.

FIG. 13 illustrates diameter performance with active and locked pull rate according to a preferred embodiment of the invention. In this exemplary graph, a first curve 287 shows the crystal diameter over the length of the ingot and a second curve 289 shows the corresponding pull rate. As described above, this example uses a combination of active and locked pull rate for achieving optimum results.

According to a preferred embodiment of the invention, an impulse, power-only diameter control for crystal body growth provides benefits in the perfect silicon growth process. Namely, the invention provides locked seed lift control in combination with a stable diameter control by tuning the diameter control. Such a control strategy provides improvements in diameter control not only in the body stage of growth but also the crystal neck, crown, early body, and late endcone stages. Advantageously, the present invention provides PID control after an impulse, or power pulse, function to provide tighter feedback when modeling errors exist in the "impulse".

It is contemplated that the locked seed lift process of the present invention may also include the use of ramped process parameter estimates that result in ramped power pulse magnitudes and/or ramped pulse widths during the run. By changing the parameters of the power pulses during the different stages of growth, the present invention provides better control matching to the process need to improve overall control.

In practice, it is important that the components used in constructing apparatus 11 (as well as crystal growing apparatus 13 ) be made to fairly tight tolerances. The following parts list provides a listing of exemplary components suitable for use with the present invention:

PLC 69: Siemens Model TI 575

Set Point Adjust 109: Ferrofluidics Part No. 207683

Servo Amp 93: Advanced Motion Controls—Model AMC 10A8

Tachometer and Servo Motor 53: Max—00 Motomatic II—Part No. 284-001-109

Encoder 85: Accu-Coder—Part No. 755A-01-0060-PU

Encoder 77: Ferrofluidics—Part No. 080010

Pulley 41: Ferrofluidics—Drawing No. 206886A

Drum 43:. Ferrofluidics—Drawing No. 206075D

Cable 37: Tungsten cable 0.10 inches in dia.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. A method for use in combination with a crystal growing apparatus for growing a monocrystalline ingot according to the Czochralski process, said crystal growing apparatus having a heated crucible containing a semiconductor melt from which the ingot is grown, said ingot being grown on a seed crystal pulled from the melt, said method comprising the steps of:

defining a temperature model representative of variations in the temperature of the melt in response to variations in power supplied to a heater for heating the melt;

generating a signal representative of an error between a target diameter of the ingot and a measured diameter of the ingot during growth;

determining a power set point for the power supplied to the heater from the temperature model as a function of the error signal and independent of a measured temperature;

adjusting the power supplied to the heater according to the power set point thereby changing the temperature of the melt to control the diameter of the ingot; and pulling the ingot from the melt at a pull rate following a target pull rate defined by a velocity profile, said velocity profile being stored in memory and defining the target pull rate independent of the error signal.

2. The method of claim 1 wherein the step of adjusting power includes calculating a pulse of power to apply to the heater, said power pulse having an amplitude greater than the steady state power.

3. The method of claim 2 wherein the step of determining the power set point includes calculating power output by the following:

$$P_1 = P_0 + G * \left[ k * \sum_{n=0}^{i} T_n - (k-1) * \sum_{n=0}^{i} T_{n-m} \right]$$

where $P_1$ is current power, $P_0$ is initial power, G is a conversion from temperature units to kW, k is the amplitude of the power pulse, $T_n$ is a signal representative of an error between target diameter and measured error at time t=n, $T_{n-m}$ is the signal representative of an error between target diameter and measured error at time t=n−m and m represents the duration of the power pulse.

4. The method of claim 1 wherein the step of determining the power set point from the temperature model includes defining an input to the temperature model, said input to the temperature model including a pulse portion followed by a steady state portion.

5. The method of claim 4 wherein the pulse portion of the input to the temperature model has an amplitude greater than a steady state value.

6. The method of claim 4 wherein the pulse portion of the input to the temperature model has a duration defined by:

$$t = -\tau * \ln(1 - 1k)$$

where $\tau$ is a time constant of an exponential function defining the temperature model and k represents the amplitude of the pulse portion of the input to the temperature model.

7. The method of claim 1 wherein the step of defining the temperature model includes defining a delay period, gain and first-order lag function response.

8. The method of claim 7 wherein the step of defining the temperature model includes defining the first-order lag function response by an exponential function of time as follows:

$$f(t) = k * (1 - \exp(-(t - t_d)/\tau))$$

where $t_d$ is the delay period occurring prior to the first-order lag function response, $\tau$ is a time constant of the function and k represents the amplitude of a power input to the temperature model.

9. The method of claim 1 further comprising the step of varying the rate at which the ingot is pulled from the melt to control diameter of the ingot, said step of varying the pull rate occurring during growth of a first portion of the ingot and said step of pulling the ingot at the target pull rate substantially following the velocity profile occurring during growth of a second portion of the ingot.

10. The method of claim 1 wherein the step of defining the temperature model includes measuring changes in the temperature of the melt in response to changes in the power supplied to the heater.

11. The method of claim 1 further including performing proportional-integral-derivative (PID) control on the error signal and generating a temperature set point as a function thereof, and wherein the power set point for the power supplied to the heater is determined from the temperature model as a function of the temperature set point generated by the PID control.

12. A method for use in combination with a crystal growing apparatus for growing a monocrystalline ingot according to the Czochralski process, said crystal growing apparatus having a heated crucible containing a semiconductor melt from which the ingot is grown, said ingot being grown on a seed crystal pulled from the melt, said method comprising the steps of:

defining a temperature model representative of variations in the temperature of the melt in response to variations in power supplied to a heater for heating the melt;

generating a signal representative of an error between a target diameter of the ingot and a measured diameter of the ingot during growth;

determining power to apply to the heater from the temperature model as a function of the error signal and independent of a measured temperature, said determined power having an amplitude greater than a steady state value;

adjusting the power applied to the heater according to the determined power thereby changing the temperature of the melt to control the diameter of the ingot; and pulling the ingot from the melt at a pull rate following a target pull rate defined by a velocity profile, said velocity profile being stored in memory and defining the target pull rate independent of the error signal.

13. The method of claim 12 wherein determining power to apply to the heater includes calculating a pulse of power to apply to the heater, said pulse of power having an amplitude greater than the steady state power.

14. The method of claim 13 wherein determining power to apply to the heater further includes calculating power output by the following:

$$P_1 = P_0 + G * \left[ k * \sum_{n=0}^{i} T_n - (k-1) * \sum_{n=0}^{i} T_{n-m} \right]$$

where $P_1$ is current power, $P_0$ is initial power, G is a conversion from temperature units to kW, k is the amplitude of the power pulse, $T_n$ is a signal representative of an error between target diameter and measured error at time t=n, $T_{n-m}$ is the-signal representative of an error between target diameter and measured error at time t=n−m and m represents the duration of the power pulse.

* * * * *